United States Patent
Jain et al.

(10) Patent No.: US 9,576,899 B2
(45) Date of Patent: Feb. 21, 2017

(54) ELECTRICAL FUSE WITH HIGH OFF RESISTANCE

(71) Applicant: GLOBALFOUNDRIES INC., Grand Cayman (KY)

(72) Inventors: Vibhor Jain, Essex Junction, VT (US); Qizhi Liu, Lexington, MA (US); Ian A. McCallum-Cook, Burlington, VT (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 14/746,891

(22) Filed: Jun. 23, 2015

(65) Prior Publication Data

US 2016/0379930 A1    Dec. 29, 2016

(51) Int. Cl.
*H01L 23/00*   (2006.01)
*H01L 23/525*   (2006.01)

(52) U.S. Cl.
CPC .................... *H01L 23/5256* (2013.01)

(58) Field of Classification Search
CPC .................................... H01L 23/5256
See application file for complete search history.

(56) References Cited

U.S. PATENT DOCUMENTS

| | | | |
|---|---|---|---|
| 4,726,991 A | 2/1988 | Hyatt et al. | |
| 6,633,055 B2 | 10/2003 | Bertin et al. | |
| 7,382,036 B2 | 6/2008 | Nowak et al. | |
| 7,479,689 B2 | 1/2009 | Kim et al. | |
| 7,656,005 B2 | 2/2010 | Booth, Jr. et al. | |
| 7,745,855 B2 | 6/2010 | Henson et al. | |
| 7,892,926 B2 | 2/2011 | Barth et al. | |
| 8,228,158 B2 | 7/2012 | Tsuda | |
| 8,236,655 B2 | 8/2012 | Barth et al. | |
| 8,912,626 B2 | 12/2014 | Maciejewski et al. | |
| 2008/0169529 A1* | 7/2008 | Kim | H01L 23/5256 257/529 |
| 2009/0283853 A1* | 11/2009 | Huebinger | H01L 23/5256 257/529 |
| 2010/0224956 A1 | 9/2010 | Kim et al. | |
| 2012/0275208 A1* | 11/2012 | Li | H01L 21/84 365/96 |
| 2013/0176073 A1 | 7/2013 | Bao et al. | |

OTHER PUBLICATIONS

TU, K.N., "Electronmigration in stress thin films," Cavendish Laboratory, Madingley Road, Cambridge CB3 OHE, United Kingdom, Physical Review B, vol. 45, No. 3, Jan. 15, 1992, The American Physical Society, pp. 1409-1413.

Rucker, H. et al., "Impact of Back End Stress on SiGe Bipolar Transistors," (IEDM11-805-IEDM11-808), IHP, Im Technologiepark 25, 15236 Frankfurt (Oder), Germany, IEEE, pp. 34.5.1-34.5.4 (2011).

* cited by examiner

*Primary Examiner* — Seahvosh Nikmanesh
(74) *Attorney, Agent, or Firm* — Thompson Hine LLP; Anthony Canale

(57) ABSTRACT

Electrical fuses and methods for forming an electrical fuse. A semiconductor substrate is implanted to define a modified region in the semiconductor substrate. Trenches that surround the modified region and that penetrate into the semiconductor substrate to a depth greater than a depth of the modified region are formed in the modified region so as to define a fuse link of the electrical fuse. The substrate is removed from beneath the fuse link with a selective etching process that removes the semiconductor substrate with a first etch rate that is higher than a second etch rate of the modified region.

18 Claims, 14 Drawing Sheets

ELECTRICAL FUSE WITH HIGH OFF RESISTANCE

BACKGROUND

The invention relates generally to semiconductor fabrication and, in particular, to methods of fabricating an electrical fuse and device structures for an electrical fuse.

Programmable devices, such as electrical fuses (efuses) and antifuses, are widely-used elements found in various programmable integrated circuits, such as redundancy circuits of dynamic random access memories and static random access memories, programmable logic devices (PLDs), I/O circuits, chip identification circuits, etc. Electrical fuses may also constitute elements of a built-in self-repair system for a chip that constantly monitors the chip functionality. If needed, the self-repair system can automatically activate one or more electrical fuses to respond to a change in the monitored conditions.

An electrical fuse includes two comparatively large plates defining an anode and a cathode, as well as a lengthy and narrow fuse link connecting the anode and cathode. When manufactured, an electrical fuse is initially closed. Electrical fuses may be dynamically programmed in real time by passing an electrical current of relatively high density through the fuse link. Large programming currents may cause the fuse link to rupture by an abrupt temperature increase and permanently open. Smaller programming currents may cause a controlled electromigration of the material constituting the fuse link. Both programming modes serve to elevate the resistance of a programmed electrical fuse in comparison with the intact electrical fuse in its unprogrammed state.

Improved structures for an electrical fuse and improved methods of manufacturing electrical fuses are needed.

SUMMARY

In an embodiment, a method is provided for forming an electrical fuse. The substrate is implanted to define a modified region in the substrate. Trenches that surround the modified region and that penetrate into the semiconductor substrate to a depth greater than a depth of the modified region are formed in the modified region so as to define a fuse link of the electrical fuse. The substrate is removed from beneath the fuse link with a selective etching process that removes the semiconductor substrate with a first etch rate that is higher than a second etch rate of the modified region.

In another embodiment, a device structure includes an electrical fuse with a first terminal, a second terminal, and a fuse link extending from the first terminal to the second terminal. The fuse link is defined from a portion of a semiconductor substrate by trenches extending into the semiconductor substrate. The fuse link overlies a cavity defined in the semiconductor substrate.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

DETAILED DESCRIPTION

Figure 1:
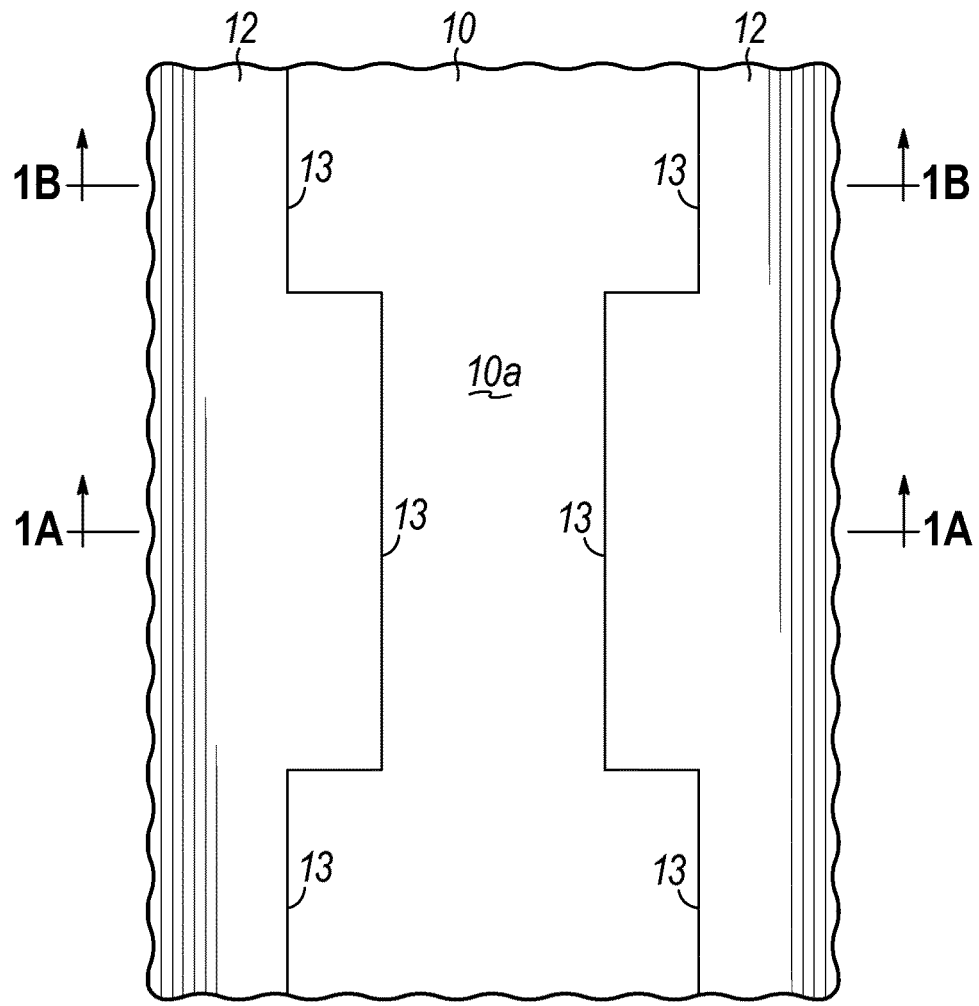
FIG. 1 is a top view of a portion of a substrate at an initial fabrication stage of a processing method for an electrical fuse in accordance with an embodiment of the invention.
Figure 1A:
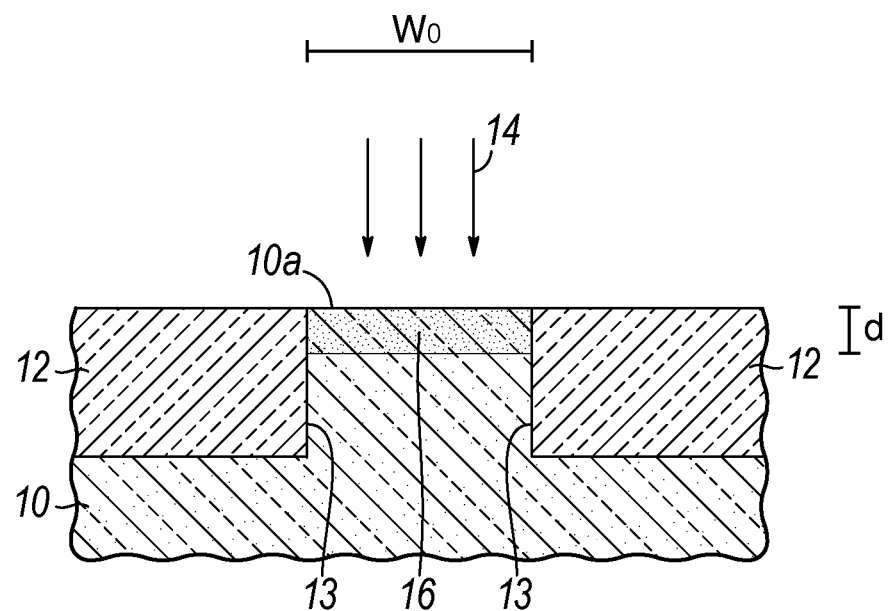
FIG. 1A is a cross-sectional view taken generally along line 1A-1A in FIG. 1.
Figure 1B:
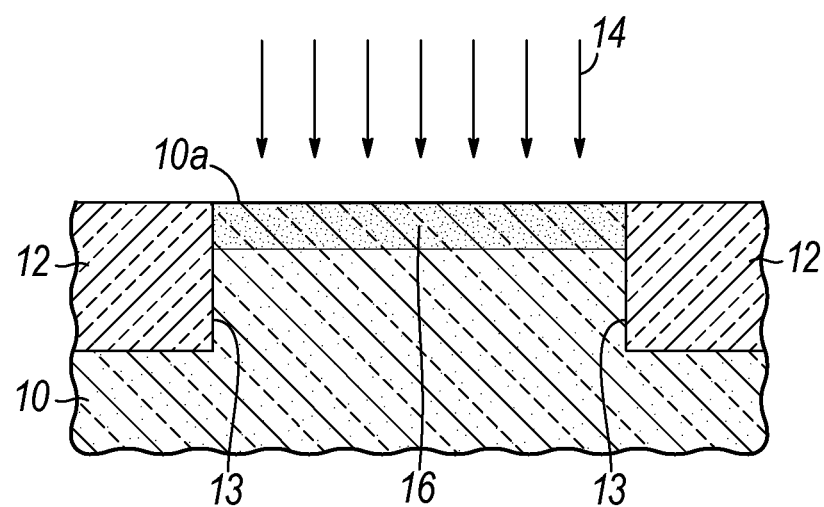
FIG. 1B is a cross-sectional view taken generally along line 1B-1B in FIG. 1.

With reference to FIGS. 1, 1A, 1B and in accordance with an embodiment of the invention, a substrate 10 comprises a single-crystal semiconductor material usable to form an electronic fuse, as well as the devices of an integrated circuit. The semiconductor material constituting the substrate 10 may include an epitaxial layer at its surface, which may contain an electrically-active dopant that alters its electrical properties. For example, the substrate 10 may include an epitaxial layer of single crystal silicon that is epitaxially deposited or grown by chemical vapor deposition (CVD) and that is doped with a concentration of an n-type dopant from Group V of the Periodic Table (e.g., phosphorus (P), arsenic (As), or antimony (Sb)) in a concentration that is effective to impart n-type conductivity. Alternatively, the epitaxial layer may be grown without doping and then all or part of it doped at a subsequent stage of the processing method by ion implantation.

Trench isolation regions 12 are formed in the substrate 10. The trench isolation regions 12 border a portion of the substrate 10 used to form the electronic fuse. The trench isolation regions 12 include inner sidewalls 13 separated by a distance that varies along a length of the substrate portion transverse to the varying distance. The substrate portion has a varying width that matches the varying separation distance of the inner sidewalls 13 of trench isolation regions 12.

The trench isolation regions 12 may be formed by a shallow trench isolation (STI) technique that relies on a photolithography and dry etching process to define trenches in substrate 10, deposits an electrical insulator to fill the trenches, and planarizes the electrical insulator relative to the top surface 10a of the substrate 10 using a chemical mechanical polishing (CMP) process. The electrical insulator may be comprised of an oxide of silicon deposited by chemical vapor deposition (CVD).

A modified region 16 is located in the substrate 10 between the inner sidewalls 13 of trench isolation regions 12. The modified region 16 has a varying width that matches the varying separation distance of the sidewalls 13 of trench isolation regions 12 and the associated varying width of the portion of substrate 10. The modified region 16 has a width $W_0$ over its narrow central region and a width greater than width $W_0$ over its wide end regions. The depth d of the modified region 16 relative to a plane containing the top surface 10a of the substrate 10 is less than the depth of the trench isolation regions 12 such that the modified region 16 is located at a shallower depth than the bottom of the trench isolation regions 12.

The modified region 16 may be comprised of semiconductor material of the substrate 10 that is modified to alter the etch rate. The modified region 16 may be formed in the substrate 10 with ion implantation by energetic ions, as indicated diagrammatically by the single-headed arrows 14, incident at the top surface 10a. The modified region 16 may include a dopant (e.g., a p-type dopant like boron) added by the implantation and/or may be implantation damaged so that its initially crystalline crystal structure is converted to a non-crystalline (e.g., amorphous) state. A mask may be present to prevent certain regions on the substrate 10 from receiving an implanted dose of the ions 14. The implantation conditions (e.g., ion energy and dose) are selected to form the modified region 16 with a desired depth profile and/or doping concentration at a shallow depth beneath the top surface of the substrate 10. The implantation conditions may be used to control the dimensions of the subsequently-formed fuse link, which may be used to regulate the extent of silicidation of the fuse link over its thickness.

Figure 2:
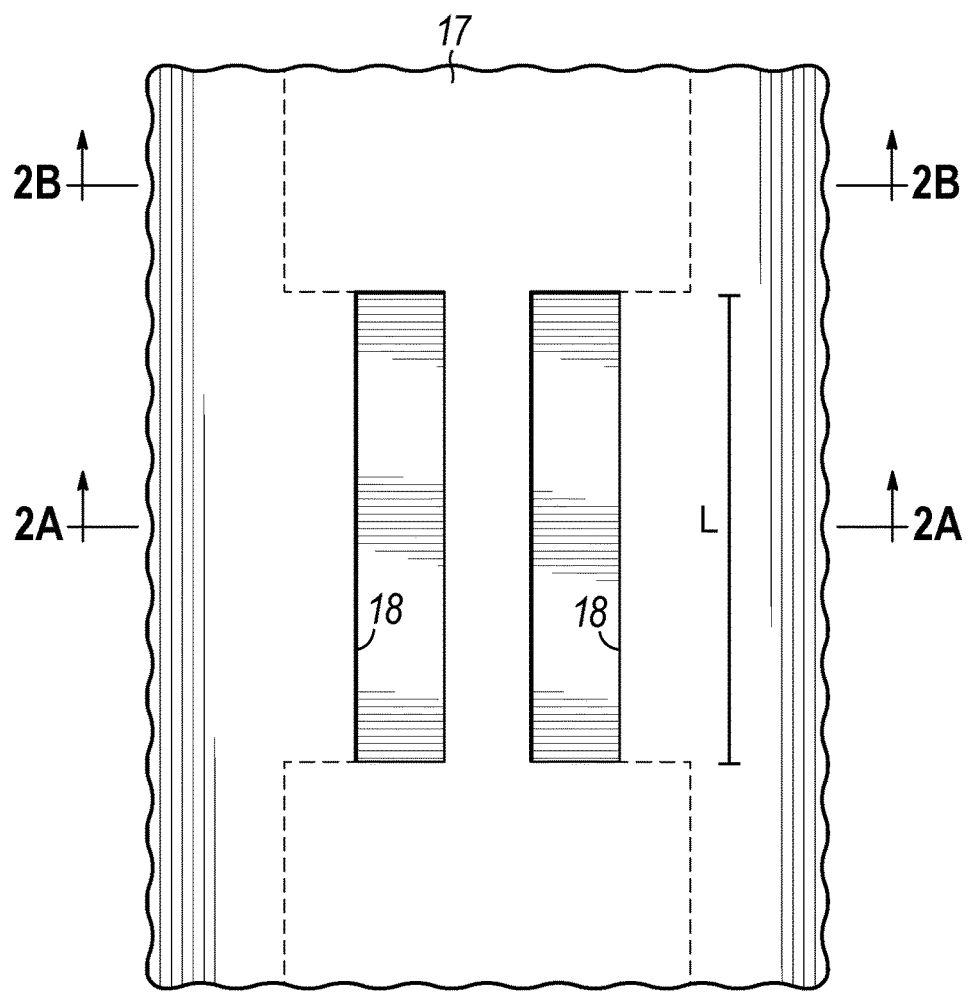
FIG. 2 is a top view of the substrate portion of FIG. 1 at a subsequent fabrication stage.
Figure 2A:
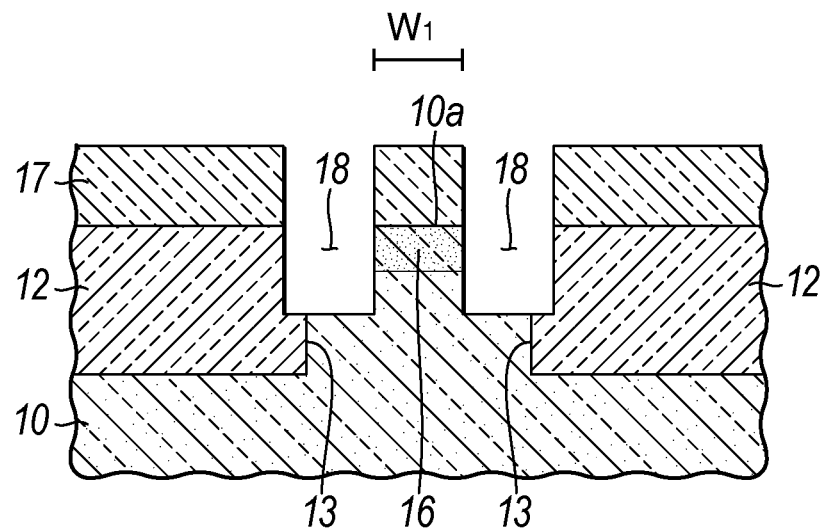
FIG. 2A is a cross-sectional view taken generally along line 2A-2A in FIG. 2.
Figure 2B:
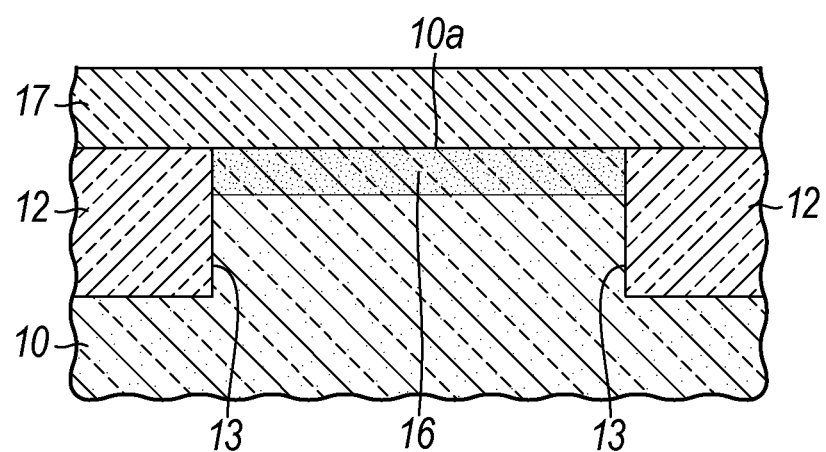
FIG. 2B is a cross-sectional view taken generally along line 2B-2B in FIG. 2.

With reference to FIGS. 2, 2A, 2B in which like reference numerals refer to like features in FIGS. 1, 1A, 1B and at a subsequent fabrication stage, a patterned mask 17 is formed that includes openings aligned with the modified region 16. The patterned mask 17 may be comprised of a layer of sacrificial material that is applied and photolithographically patterned. To that end, the layer may be comprised of a photoresist that is applied by a spin coating process, pre-baked, exposed to a radiation projected through a photomask, baked after exposure, and developed with a chemical developer to form the mask 17 with openings at the future location of trenches 18.

A dry etch process, such as a reactive ion etch (RIE), may be used to remove portions of the modified region 16 and, optionally, portions of the trench isolation regions 12 that are not protected by the mask 17 in order to form the trenches 18. In the representative embodiment, each of the trenches 18 comprises a portion of the substrate 10 and a portion of the trench isolation regions 12 adjacent to the substrate 10. In an alternative embodiment, each of the trenches 18 comprises only a portion of the substrate 10. The trenches 18 at their base may extend to a greater depth into the substrate 10 than the depth d of the modified region 16 and to a lesser depth into the substrate 10 than the bottom of the trench isolation regions 12. The trenches 18, which may have vertical sidewalls, function to recess the substrate 10 adjacent to the modified region 16 so that the modified region can be accessed for a subsequent etching process. The trenches 18, which may be aligned parallel, terminate at opposite ends at regions of the substrate 10 between the trench isolation regions 12 that are masked.

The central masked region of the modified region 16 subsequently become the fuse link of the electronic fuse. The peripheral masked regions of the modified region 16 at the ends of the central masked region subsequently become the anode and cathode of the electronic fuse.

Figure 3:
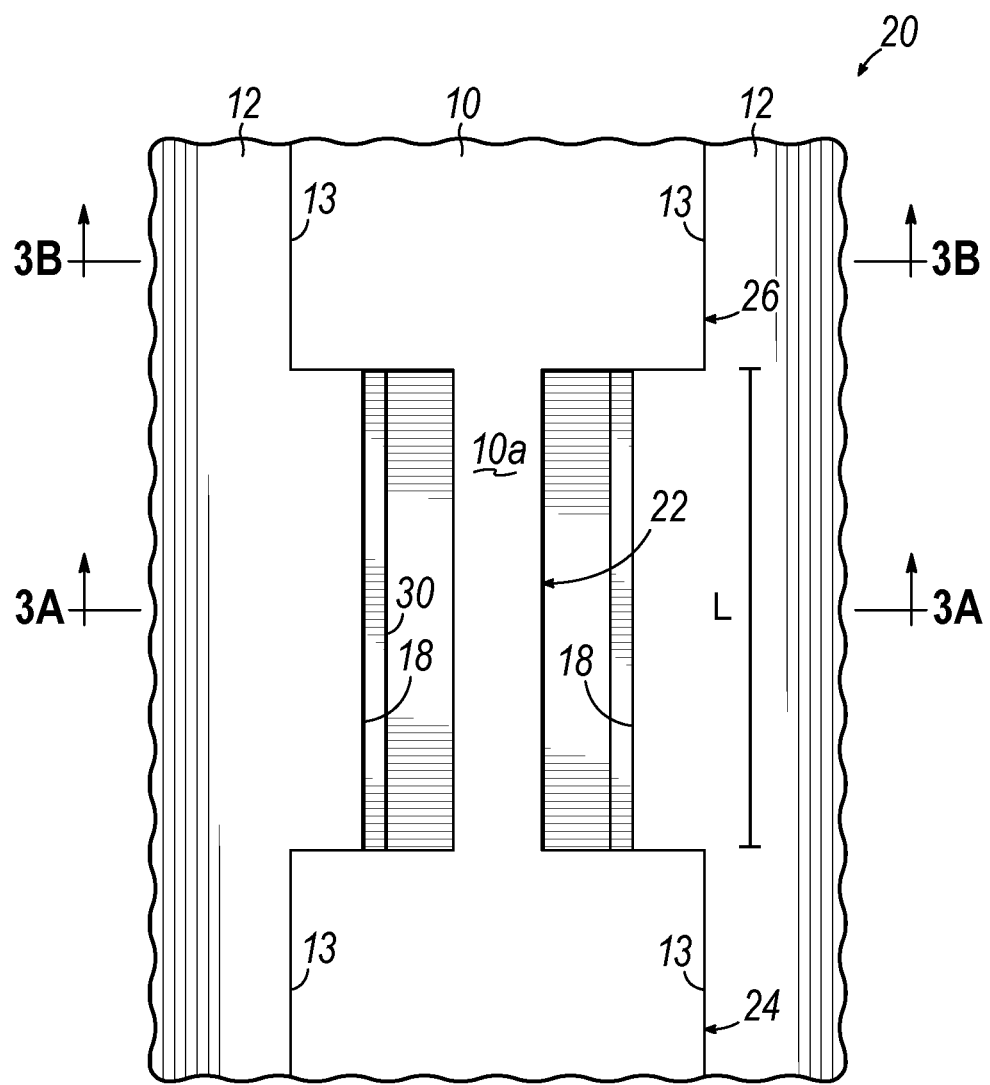
FIG. 3 is a top view of the substrate portion of FIG. 2 at a subsequent fabrication stage.
Figure 3A:
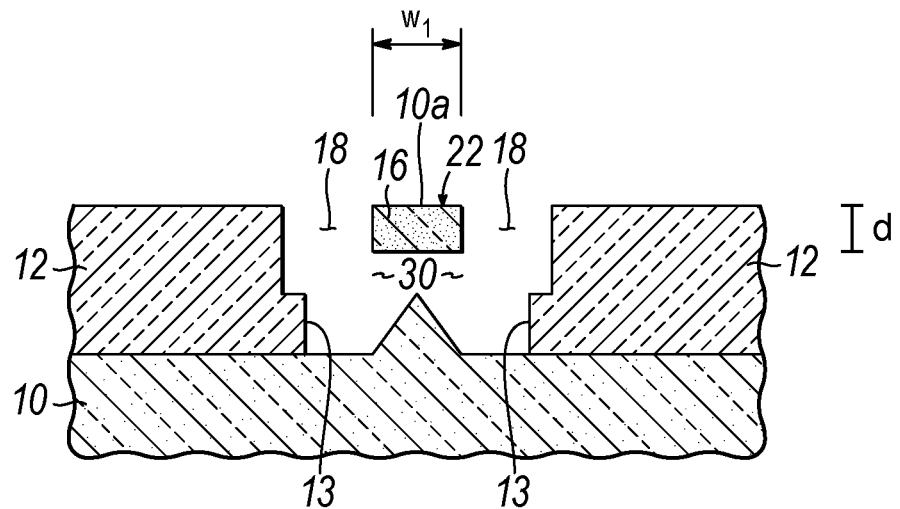
FIG. 3A is a cross-sectional view taken generally along line 3A-3A in FIG. 3.
Figure 3B:
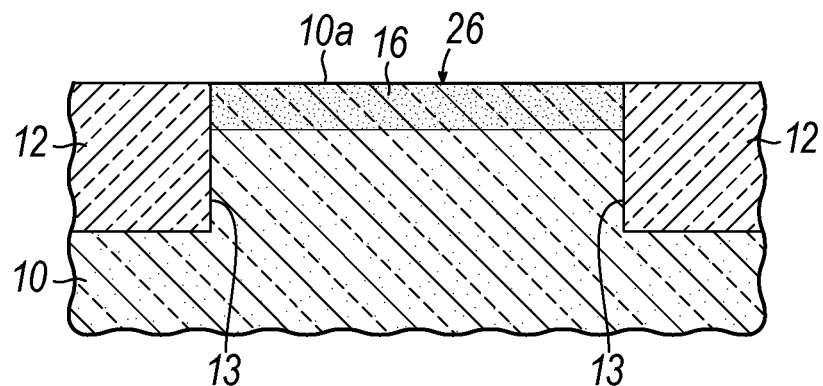
FIG. 3B is a cross-sectional view taken generally along line 3B-3B in FIG. 3.

With reference to FIGS. 3, 3A, 3B in which like reference numerals refer to like features in FIGS. 2, 2A, 2B and at a subsequent fabrication stage, the mask 17 is removed after the trenches 18 are formed in the substrate 10. If comprised of photoresist, the mask 17 may be removed by oxygen plasma ashing or chemical stripping.

A wet chemical etching process may be utilized to remove the material of the substrate 10 selective to the semiconductor material in the modified region 16 and the dielectric material of the trench isolation regions 12. The concentration of the element introduced by the ion implantation provides the etch rate selectivity (i.e., the higher etch rate) of the substrate 10 relative to the modified region 16. An exemplary etching process may be a wet chemical etch using a solution of potassium hydroxide (KOH), potassium dichromate ($K_2Cr_2O_7$), propanol, and water that removes undoped or lightly doped silicon comprising semiconductor region 10 selective to p-type doped silicon region 16.

As an example, the etch rate of the modified region 16 may be less than the etch rate of the substrate 10 if the modified region 16 contains a high boron-doping concentration (e.g., greater than $1 \times 10^{19}$ cm$^{-3}$). The substrate 10, conversely, may contain a light concentration of a dopant (e.g., arsenic or phosphorus) of a different conductivity type.

An electrical fuse 20 (i.e., efuse) includes a terminal in the representative form of an anode 24, another terminal in the representative form of a cathode 26, and a fuse link 22 extending between the anode 24 and the cathode 26. At this fabrication stage, the fuse link 22 comprises a narrow strip of the modified region 16 having a narrower cross-sectional area determined by a width $W_1$ and the depth d, and a length L relative to the locations of the anode 24 and cathode 26. The anode 24 and cathode 26 each have a width that are greater than the width $W_1$ of the fuse link 22. The designation of the anode 24 and cathode 26 as terminals may be swapped depending upon the polarity of the bias potential applied to the electrical fuse 20 during programming.

A cavity 30 is defined by the wet chemical etching process in the substrate 10 between the trench isolation regions 12 and beneath the fuse link 22 at the former location of the removed semiconductor material of the substrate 10. The thickness of the fuse link 22 is established by the implantation conditions for the ions 14 used to define the depth of the modified region 16. The cavity 30 extends beneath and underlies the fuse link 22. The fuse link 22 defines a beam that is supported at opposite ends by the anode 24 and cathode 26, and that is suspended above the underlying cavity 30. The base of the cavity 30 may include topography as shown in the representative embodiment or may be planar. The depth of the trenches 18 may, among other factors, influence the topography of the base of the cavity 30.

Figure 4:
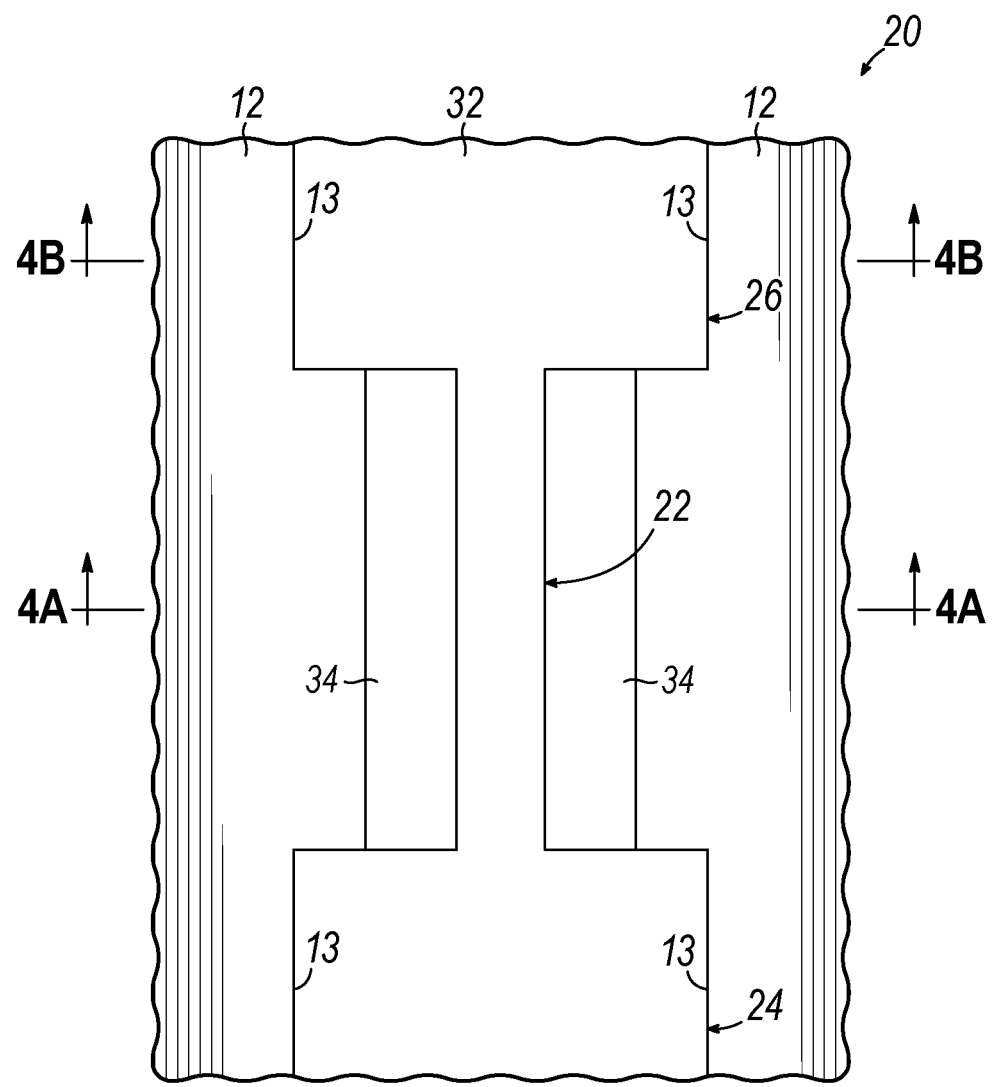
FIG. 4 is a top view of the substrate portion of FIG. 3 at a subsequent fabrication stage.
Figure 4A:
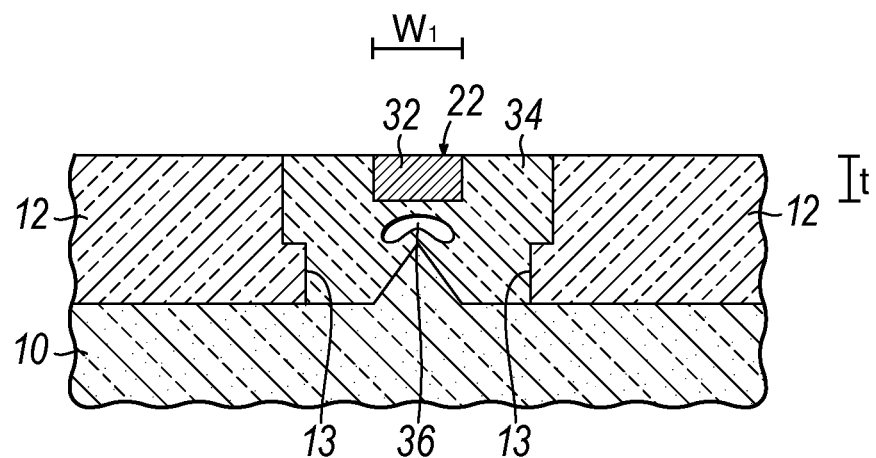
FIG. 4A is a cross-sectional view taken generally along line 4A-4A in FIG. 4.
Figure 4B:
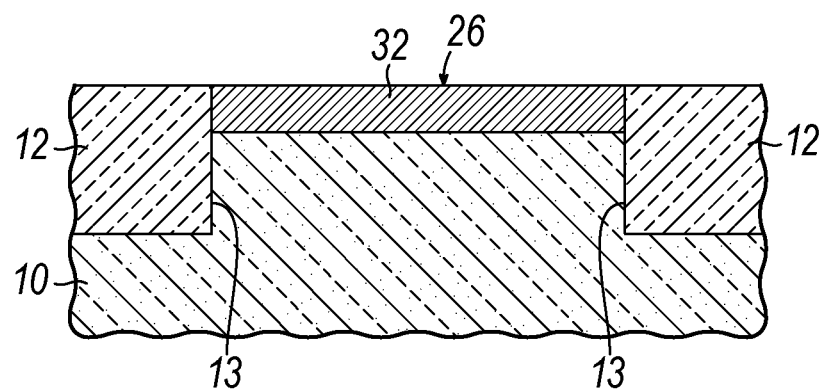
FIG. 4B is a cross-sectional view taken generally along line 4B-4B in FIG. 4.

With reference to FIGS. 4, 4A, 4B in which like reference numerals refer to like features in FIGS. 3, 3A, 3B and at a subsequent fabrication stage, the semiconductor material of the modified region 16, and in particular the section of the modified region 16 comprising the fuse link 22, may be converted to a silicide layer 32. A silicidation process is employed that involves one or more annealing steps to form a silicide phase by reacting a layer of silicide-forming metal and the semiconductor material contacting the silicide-forming metal. Candidate refractory metals for the silicide-forming metal include, but are not limited to, titanium (Ti), cobalt (Co), or nickel (Ni). The silicide-forming metal may be deposited by, for example, a CVD process or a physical vapor deposition (PVD) process. A capping layer comprised of a metal nitride, such as sputter-deposited titanium nitride (TiN), may be applied to cap the silicide-forming metal. An initial annealing step of the silicidation process may form a metal-rich silicide that consumes the silicide-forming metal and then form a silicide of lower metal content that grow by consuming the metal-rich silicide. Following the initial annealing step, any remaining silicide-forming metal and the optional capping layer may be removed by wet chemical etching. The silicide layer 32 may then be subjected to an additional annealing step at a higher temperature to form a lower-resistance silicide phase.

The silicide layer 32 is confined to the modified region 16 comprising the fuse link 22, the anode 24, and cathode 26 because the silicide-forming metal does not react with the dielectric material of the trench isolation regions 12 and is removed after silicidation of the modified region 16 in the self-aligned process. The semiconductor material of the fuse link 22 may be completely converted to the silicide layer 32 over its entire width $W_1$ and length L. The semiconductor material of the fuse link 22 may be completely converted to the silicide layer 32 so that the fuse link 22 is fully silicided over its entire thickness t. The thickness t over which the fuse link 22 is silicided is related to the depth d of the modified region 16 and can be controlled through selection of the depth d. Because the silicide layer 32 has a lower electrical resistivity, the silicided fuse link 22 has a current-carrying capacity that is greater than the current-carrying capacity of the non-silicided semiconductor material of the modified region 16.

In an alternative embodiment, the fuse link 22 may be partially converted to the silicide layer 32 over its thickness t such that the fuse link 22 is comprised of silicide over a range of one-half of its thickness t to less than the thickness t. In this alternative embodiment, the fuse link 22 is comprised partially of the semiconductor material of modified region 16 and partially of the silicide of silicide layer 32.

A dielectric layer 34 is formed and planarized so that the cavity 30 is partially filled by its dielectric material. The dielectric layer 34 may be comprised of an electrical insulator or dielectric material such as silicon dioxide, and may be formed by wet or dry thermal oxidation, chemical vapor deposition, or a combination of these processes. The dielectric layer 34 may incorporate a void 36 that is positioned beneath the fuse link 22. The void 36 may result from incomplete filling of the cavity 30 by the dielectric material constituting the dielectric layer 34.

The void 36 may be an airgap characterized by an effective permittivity or dielectric constant of near unity (vacuum permittivity). The void 36 may be filled by air at or near atmospheric pressure, may be filled by another gas at or near atmospheric pressure, or may contain air or another gas at a sub-atmospheric pressure (e.g., a partial vacuum). The void 36 provides an open volume or space underlying the fuse link 22 and assists in promoting reliable programming of the electrical fuse 20.

The electrical fuse 20 may have an increased Off resistance (when programmed) without reducing the On resistance (when intact) so as to increase the ratio of Off resistance to On resistance. Increasing this ratio may ease detection when the electrical fuse 20 used in a circuit. The degree of silicidation of the fuse link 22 and/or the presence of the void 36 may independently or collectively contribute to the improvement in the on/off ratio. The improvement may provide a statistically-significant improvement in programmed fuse blow over a large population of electrical fuses 20.

The programming of the electrical fuse 20 can occur by electromigration and/or by rupture. The programmed electrical fuse 20 may exhibit a soft blow regime that relies on electromigration as a mechanism to alter (i.e., increase) the resistance of the electrical fuse 20 while maintaining a closed electrical circuit for current flow. The programmed electrical fuse 20 may also exhibit an open or hard blown state that relies on layer rupture as a mechanism to elevate the resistance of the electrical fuse 20. The hard blown state of the programmed electrical fuse 20 is characterized by a relatively large resistance in comparison with the different states in the soft blown regime.

Before programming is initiated, the electrical fuse 20 has an initial state characterized by an initial value of resistance, which is relatively low. The electrical fuse 20 defines a closed circuit path from the anode 24 to the cathode 26. The electrical fuse 20 may be connected with programming circuitry, which may consist of one or more transistors (e.g., thick-oxide n-FETs connected in series) designed to draw a large amount of current. The electrical fuse 20 may also be connected with sense circuitry that reads the state of the electrical fuse 20. The sense circuitry can measure the resistance of the electrical fuse 20 to determine whether the electrical fuse 20 has been programmed or is intact. In particular, the sense circuitry can measure an approximate value of the fuse resistance to determine the state of the fuse. One approach to measuring the fuse resistance is to compare the measured fuse resistance with the known resistance of a reference resistor. Control logic directs the fuse program operations of the programming circuitry and the fuse read operations of the sense circuitry. The programming and sensing voltages may be derived from an external voltage source.

During programming of the electrical fuse 20, a bias potential is applied between anode 24 and cathode 26. The bias potential may be applied in a pulse train or as a single pulse of a lengthier duration. Electrical current of relatively high density flows through the fuse link 22 from the cathode 26 to the anode 24. As electrical current flows through the fuse link 22, the temperature of the fuse link 22 is elevated by ohmic heating. The elevated temperature combined with the high current density may promote electromigration of the conductive material of the silicide layer 32 in a direction toward the anode 24. If the fuse link 22 is partially silicided, then the semiconductor material of the modified region 16 will be present and may also exhibit electromigration.

The space formerly occupied by the electromigrated material of the fuse link 22 may become a void that opens the circuit and that is not capable of carrying current. The rate and extent of the electromigration and void size during programming of the electrical fuse 20 is contingent on the temperature developed in the fuse link 22 and the current density flowing through the fuse link 22. The programming may also rupture the polysilicon, if the fuse link 22 is not completely silicided, in a region previously voided to interrupt the electrical continuity of the fuse link 22 and open the electrical fuse 20 and provide a hard blown state. The resistance of the electrical fuse 20 in the hard blown state may be orders of magnitude greater than the resistance in the initial state and in the soft blown state. Once programmed, the electrical fuse 20 cannot be re-programmed back to a low-resistance, closed state as the programming is irreversible.

Figure 5:
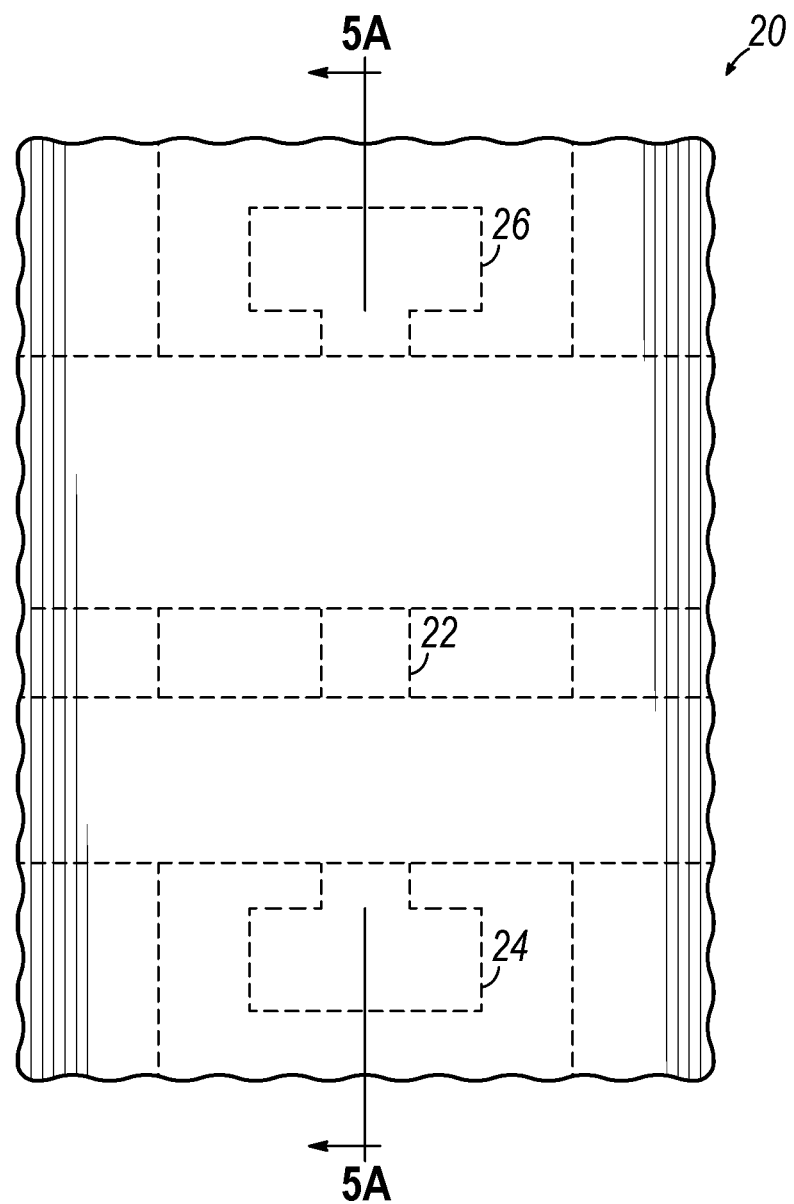
FIG. 5 is a top view is a top view of a device structure, which includes an electrical fuse, in accordance with an alternative embodiment of the invention.
Figure 5A:
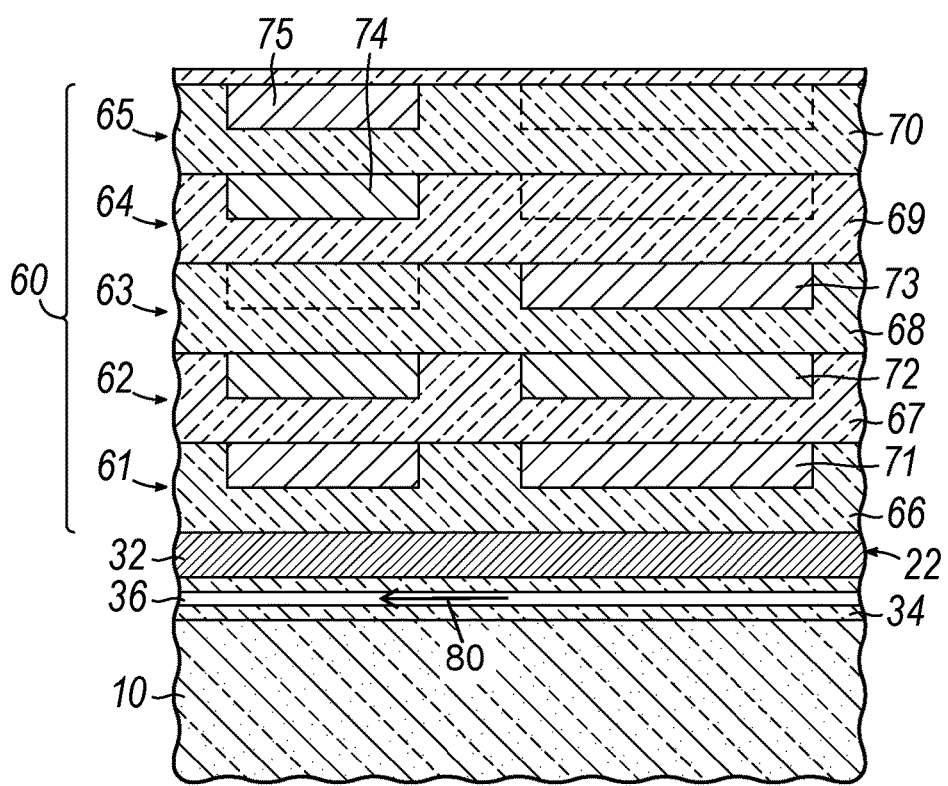
FIG. 5A is a cross-sectional view taken generally along line 5A-5A in FIG. 5.

With reference to FIGS. 5, 5A in which like reference numerals refer to like features in FIGS. 4, 4A, 4B and in accordance with an alternative embodiment, middle-of-line (MOL) and back-end-of-line (BEOL) processing follows front-end-of-line processing to produce the electrical fuse 20 to form a multi-level interconnect structure 60. The interconnect structure 60 includes a plurality of stacked wiring levels 61-65. Each of the wiring levels includes a respective dielectric layer 66-70 and metal lines 71-75 embedded in the dielectric layers 66-70. The metal lines 71-75 may be dummy structures that do not participate within the interconnect structure 60 to supply conductive paths for signals, clock, power, etc.

The metal lines 71-75 may be formed by deposition, polishing, lithography, and etching techniques characteristic of a damascene process. Candidate conductors for the metal lines 71-75 are metals such as copper (Cu) and aluminum (Al). These types of metals may be deposited by chemical vapor deposition or an electrochemical process like electroplating or electroless plating. The dielectric layers 66-70 may be comprised of any suitable organic or inorganic dielectric material, such as silicon dioxide, hydrogen-enriched silicon oxycarbide (SiCOH), fluorosilicate glass (FSG), or another type of low-k dielectric material that may be deposited by chemical vapor deposition, such as low-pressure chemical vapor deposition or plasma-enhanced chemical vapor deposition (PECVD).

The metal lines 71-75 are located above the electrical fuse 20 and, in particular, are located above the fuse link 22. The metal lines 71-75 may introduce directional stress, diagrammatically indicated by reference numeral 80, into the fuse link 22 of the underlying electrical fuse 20. The directional stress may serve to enhance electromigration in the fuse link 22, which may operate to create a statistically significant increase in the off resistance of the electrical fuse 20 over a large population of electrical fuses 20. The directional stress may also reduce the current needed to rupture the fuse thereby reducing the size of the programming circuit attached to the e-fuse. The directional stress 80 may be introduced without the necessity of additional masks in the fabrication process. The directional stress 80 may comprise tensile stress, compressive stress, or a combination of these different types of stresses.

The placement of the metal lines 71-75 may be optimized to generate a maximal stress gradient along the fuse link 22. The wiring levels 61-65 include different numbers of metal lines 71-75 arranged along the length of the fuse link 22. In the arrangement, certain of the wiring levels 61-65 may be fully populated by metal lines 71-75 and other of the wiring levels 61-65 may only be partly populated by metal lines 71-75. For example, in the representative embodiment, wiring level 61 is fully populated by metal lines 71, wiring level 62 is fully populated by metal lines 72, and wiring levels 63-65 are partly populated by metal lines 73-75. In wiring level 63, one of metal lines 73 proximate to the anode 24 is missing as indicated by the dashed lines. In wiring level 64, one of metal lines 74 proximate to the cathode 26 is missing as indicated by the dashed lines. Similarly, in wiring level 65, one of metal lines 75 proximate to the cathode 26 is missing as indicated by the dashed lines. The asymmetrical arrangement of the metal lines 73-75 in the wiring levels 63-65 produces the directional stress imparted to the fuse link 22.

Figure 6:
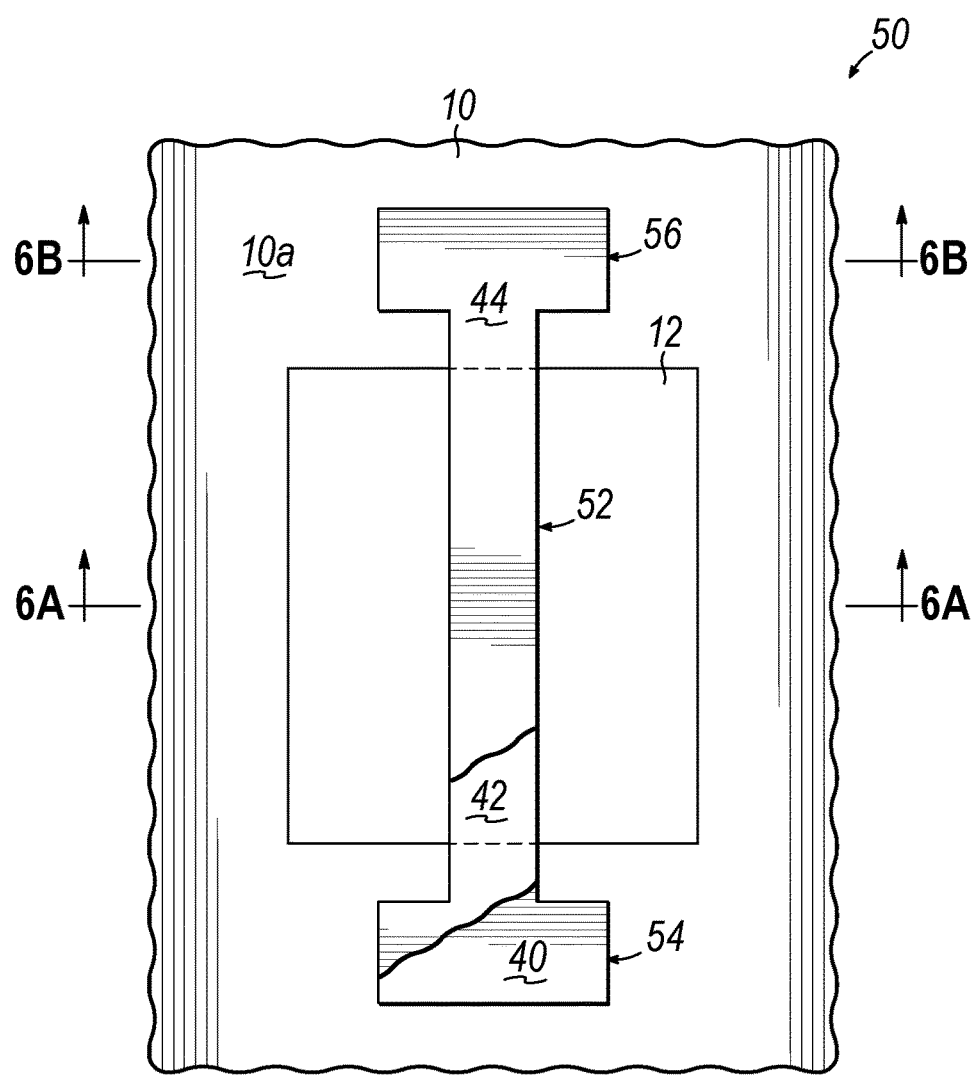
FIG. 6 is a top view of a portion of a substrate at an initial fabrication stage of a processing method for an electrical fuse in accordance with an embodiment of the invention.
Figure 6A:
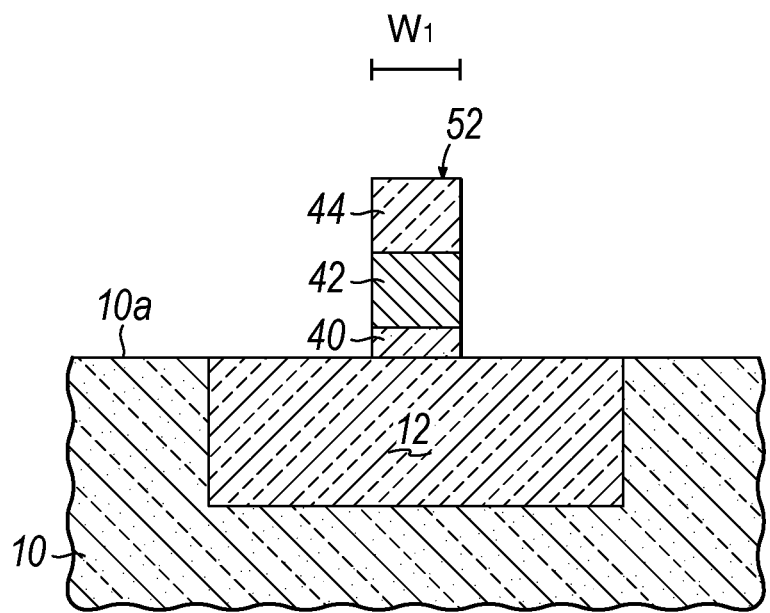
FIG. 6A is a cross-sectional view taken generally along line 6A-6A in FIG. 6.
Figure 6B:
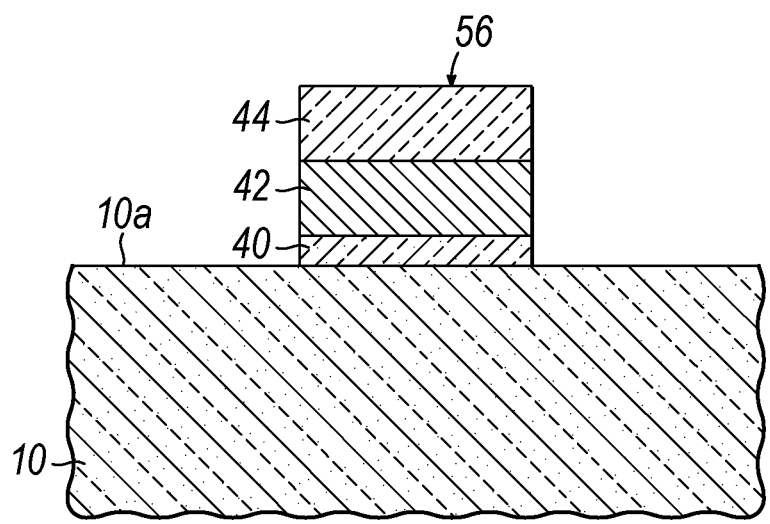
FIG. 6B is a cross-sectional view taken generally along line 6B-6B in FIG. 6.

With reference to FIGS. 6, 6A, 6B in which like reference numerals refer to like features in FIGS. 1, 1A, 1B and in accordance with an alternative embodiment of the invention, a layer 40 of a semiconductor material is deposited as a continuous additive layer on the top surfaces of the substrate 10 and trench isolation regions 12. The layer 40 may be comprised of a material suitable for forming an intrinsic base of a heterojunction bipolar transistor. The layer 40 may be comprised of a semiconductor material, such as silicon-germanium (SiGe) including silicon (Si) and germanium (Ge) in an alloy with the silicon content ranging from 95 atomic percent to 50 atomic percent and the germanium content ranging from 5 atomic percent to 50 atomic percent. The layer 40 may be formed using a low temperature epitaxial (LTE) growth process, such as vapor phase epitaxy (VPE) that may be conducted at a growth temperature ranging from 400° C. to 850° C.

A layer 42 of a semiconductor material is deposited as a continuous additive layer on the top surface of the layer 40. The layer 42 may be comprised of a material (e.g., highly doped polysilicon) suitable for forming an extrinsic base of a heterojunction bipolar transistor in a BiCMOS process. In one embodiment, layer 42 may be comprised of polycrystalline semiconductor material (e.g., polysilicon) deposited by CVD process. Layer 42 can be doped with a concentration of a p-type dopant from Group III of the Periodic Table (e.g., boron (B)) during growth.

A patterned mask 44 is formed on a top surface of layer 42 and is used to pattern an electrical fuse 20 from the layers 40, 42. The patterned mask 44 may be comprised of a layer of sacrificial material that is applied and photolithographically patterned. To that end, the layer may be comprised of a photoresist that is applied by a spin coating process, pre-baked, exposed to a radiation projected through a photomask, baked after exposure, and developed with a chemical developer to form the mask 44. If comprised of photoresist, the mask 44 may be removed following the subsequent etch process by oxygen plasma ashing or chemical stripping.

A dry etch process (e.g., reactive ion etching) may be used to remove portions of layers 40, 42 that are not protected by the mask 44 in order to pattern an electrical fuse 50. The electrical fuse 50 includes a fuse link 52 extending between one terminal in the representative form of an anode 54 and another terminal in the representative form of a cathode 56. The fuse link 52 has a width, $w_1$, and the anode 54 and cathode 56 have a width that is greater than the width, $w_1$, of the fuse link 52.

Figure 7:
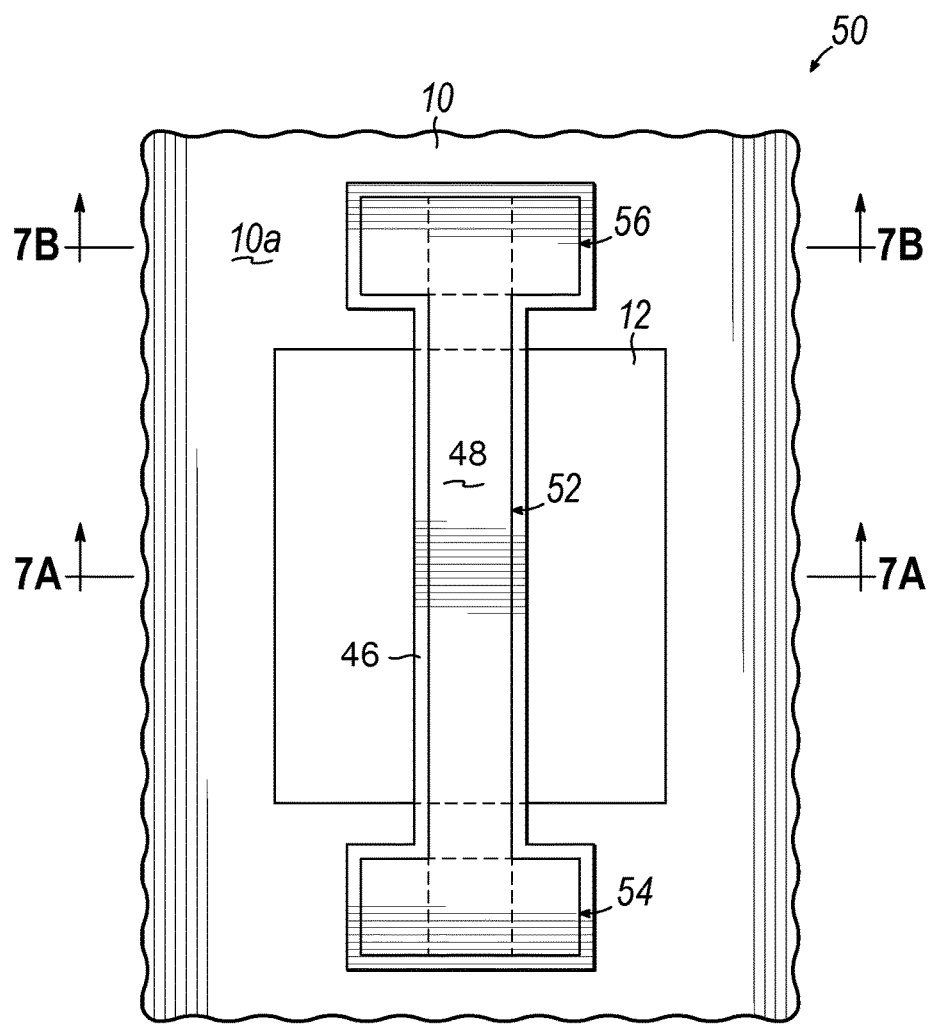
FIG. 7 is a top view of the substrate portion of FIG. 6 at a subsequent fabrication stage.
Figure 7A:
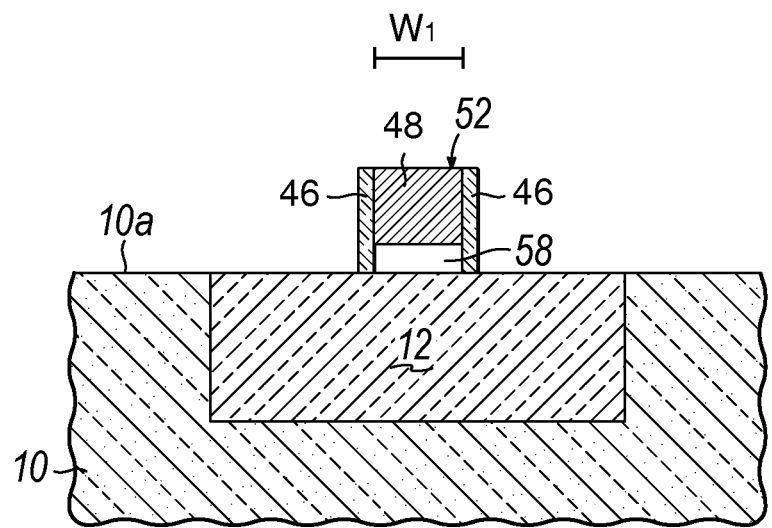
FIG. 7A is a cross-sectional view taken generally along line 7A-7A in FIG. 7.
Figure 7B:
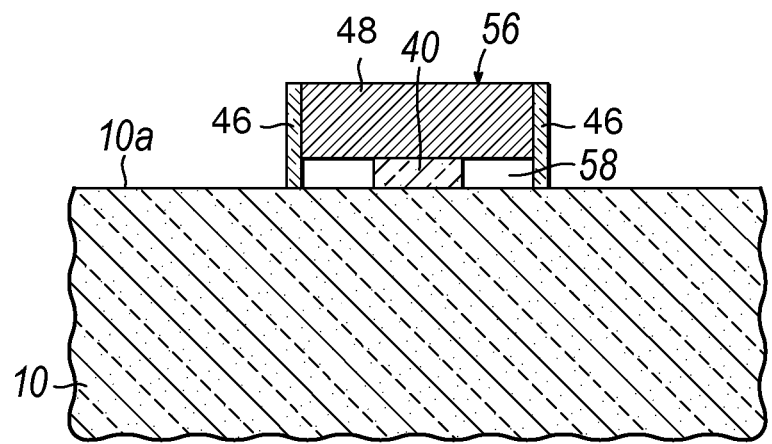
FIG. 7B is a cross-sectional view taken generally along line 7B-7B in FIG. 7.

With reference to FIGS. 7, 7A, 7B in which like reference numerals refer to like features in FIGS. 6, 6A, 6B and at a subsequent fabrication stage, a wet chemical etching process may be utilized to remove the material of the layer 40 selective to (i.e., at a higher etch rate than) the semiconductor material of the layer 42. The compositional difference between layer 40 and layer 42 (e.g., the presence of germanium) is effective to provide the etch rate selectivity (i.e., the higher etch rate) for layer 40 in comparison with layer 42.

The conditions for the wet chemical etch process are selected to completely remove the portion of layer 40 beneath the fuse link 52 of the electrical fuse 50 and only partially remove the portion of layer 40 beneath the anode 54 and cathode 56. As a result, the space beneath the fuse link 52 is empty of solid material and defines an airgap 58. The airgap 58 overlies one of the trench isolation regions 12. The airgap 58 may be characterized by an effective permittivity or dielectric constant of near unity (vacuum permittivity). The airgap 58 may be filled by air at or near atmospheric pressure, may be filled by another gas at or near atmospheric pressure, or may contain air or another gas at a sub-atmospheric pressure (e.g., a partial vacuum).

Spacers 46 are formed at a periphery of the fuse link 52, anode 54 and cathode 56. The spacers 46 have dimensions (e.g., height and thickness) configured to occlude or close entrances to the airgap 58. The spacers 46 may be formed by depositing a conformal layer comprised of an electrical insulator, such as silicon nitride ($Si_3N_4$) deposited by CVD, and shaping the conformal layer with an anisotropic etching process, such as RIE, that preferentially removes the electrical insulator from horizontal surfaces.

The semiconductor material of layer 42, and in particular the section of layer 42 comprising the fuse link 52, may be converted to a silicide layer 48 using a silicidation process as described above for the conversion of the fuse link 22 to silicide layer 32.

The entire layer 42 in at least the section of the electrical fuse 50 comprising the fuse link 52 may be converted to the silicide layer 48 so that the fuse link 52 is fully silicided over its entire thickness. In an alternative embodiment, the thickness of the layer 42 that is converted to the silicide layer 48 may be between one-half of the original thickness of layer 42 and less than the full original thickness of layer 42. In this alternative embodiment, the fuse link 52 is comprised of a composite of the semiconductor material of layer 42 and the silicide layer 48. Due to the composition of its material and a lower electrical resistivity, the silicide layer 48 has a current-carrying capacity that is greater than the current-carrying capacity of layer 42.

The fuse link 52 comprises a narrow strip of conductive material having a narrower cross-sectional area and a smaller surface area (e.g., length and width) than either the anode 54 or cathode 56. The airgap 58 underlies the fuse link 52 and promotes reliable programming of the electrical fuse 50.

The methods as described above are used in the fabrication of integrated circuit chips. The resulting integrated circuit chips can be distributed by the fabricator in raw wafer form (that is, as a single wafer that has multiple unpackaged chips), as a bare die, or in a packaged form. The chip may be integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

A feature may be "connected" or "coupled" to or with another element may be directly connected or coupled to the other element or, instead, one or more intervening elements may be present. A feature may be "directly connected" or "directly coupled" to another element if intervening elements are absent. A feature may be "indirectly connected" or "indirectly coupled" to another element if at least one intervening element is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of forming an electrical fuse, the method comprising:
   implanting a semiconductor substrate over a first depth to define a modified region in the semiconductor substrate;
   forming a plurality of trenches that penetrate through the modified region and into the semiconductor substrate to a second depth greater than the first depth of the modified region so as to define a fuse link of the electrical fuse; and
   removing the semiconductor substrate from beneath the fuse link with a selective etching process that removes the semiconductor substrate with a first etch rate that is higher than a second etch rate of the modified region.

2. The method of claim 1 further comprising:
   siliciding the fuse link such that silicide comprises at least one-half of a thickness of the fuse link.

3. The method of claim 1 further comprising:
   fully siliciding the fuse link.

4. The method of claim 1 wherein the modified region includes a concentration of a dopant that reduces the second etch rate relative to the first etch rate.

5. The method of claim 4 wherein the modified region further includes implantation damage that reduces the second etch rate relative to the first etch rate.

6. The method of claim 1 wherein the modified region includes implantation damage that reduces the second etch rate relative to the first etch rate.

7. The method of claim 1 wherein a plurality of trench isolation regions border the modified region, and removing the semiconductor substrate from beneath the fuse link comprises:
   defining a cavity underlying the fuse link by wet chemical etching that removes the substrate selective to the trench isolation regions and to the modified region.

8. The method of claim 7 further comprising:
   depositing a dielectric layer in the trenches and in the cavity.

9. The method of claim 8 wherein the dielectric layer includes a void beneath the fuse link.

10. The method of claim 9 further comprising:
    siliciding the fuse link such that silicide comprises at least one-half of a thickness of the fuse link.

11. The method of claim 9 further comprising:
    fully siliciding the fuse link.

12. The method of claim 1 further comprising:
    forming a plurality of metal features in a plurality of wiring levels overlying the fuse link,
    wherein the metal features are arranged in the wiring levels to introduce directional stress into the fuse link.

13. The method of claim 12 wherein a first arrangement of the metal features in one of the wiring levels differ from a second arrangement of the metal features in another of the wiring levels in a direction parallel to a length of the fuse link.

14. The method of claim 1 wherein a cavity is defined beneath the fuse link when the semiconductor substrate is removed from beneath the fuse link, the fuse link defines a beam that is supported at a first end by a first region of the substrate defining an anode of the electrical fuse and at a second end by a second region of the substrate defining a cathode of the electrical fuse, and the fuse link is suspended above the cavity.

15. The method of claim 1 wherein forming the trenches that penetrate through the modified region and into the semiconductor substrate to the second depth greater than the first depth of the modified region so as to define the fuse link of the electrical fuse comprises:

forming a mask patterned with openings; and etching the semiconductor substrate with the selective etching process at respective locations of the openings to form the trenches.

16. The method of claim 15 wherein the fuse link defines a beam that is supported at a first end by a first region of the substrate defining an anode of the electrical fuse and at a second end by a second region of the substrate defining a cathode of the electrical fuse, and the anode and the cathode are masked by the mask when the trenches are formed.

17. The method of claim 1 wherein the semiconductor substrate underlying the modified region is accessed via the trenches during the selective etching process removing the semiconductor substrate from beneath the fuse link.

18. The method of claim 1 wherein the fuse link defines a beam that is supported at a first end by a first region of the substrate defining an anode of the electrical fuse and at a second end by a second region of the substrate defining a cathode of the electrical fuse.

\* \* \* \* \*